US009598787B2

(12) United States Patent
Jayaraju et al.

(10) Patent No.: US 9,598,787 B2
(45) Date of Patent: Mar. 21, 2017

(54) METHOD OF FILLING THROUGH-HOLES

(71) Applicant: Rohm and Haas Electronic Materials LLC, Marlborough, MA (US)

(72) Inventors: Nagarajan Jayaraju, Framingham, MA (US); Elie H. Najjar, Norwood, MA (US); Leon R. Barstad, Raynham, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 427 days.

(21) Appl. No.: 13/829,143

(22) Filed: Mar. 14, 2013

(65) Prior Publication Data

US 2014/0262799 A1    Sep. 18, 2014

(51) Int. Cl.
| | |
|---|---|
| *C25D 5/34* | (2006.01) |
| *C25D 3/38* | (2006.01) |
| *C25D 5/02* | (2006.01) |
| *C25D 5/10* | (2006.01) |
| *H05K 3/42* | (2006.01) |
| *C23C 18/16* | (2006.01) |

(52) U.S. Cl.
CPC ............... *C25D 5/34* (2013.01); *C25D 3/38* (2013.01); *C25D 5/02* (2013.01); *C25D 5/022* (2013.01); *C25D 5/10* (2013.01); *H05K 3/423* (2013.01); *C23C 18/1653* (2013.01)

(58) Field of Classification Search
CPC . C25D 3/38; C25D 5/02; C25D 5/565; C25D 5/34; C25D 5/022
USPC ........................................................ 205/118
See application file for complete search history.

(56) References Cited

U.S. PATENT DOCUMENTS

| | | | |
|---|---|---|---|
| 3,751,289 A * | 8/1973 | Arcilesi | ................... 427/436 |
| 6,562,222 B1 * | 5/2003 | Sekiguchi | ............... C25D 3/38 |
| | | | 205/210 |
| 6,755,957 B2 | 6/2004 | Nakamura et al. | |
| 6,773,573 B2 | 8/2004 | Gabe et al. | |
| 6,911,068 B2 | 6/2005 | Cobley et al. | |
| 7,501,014 B2 | 3/2009 | Poole et al. | |
| 7,611,569 B2 | 11/2009 | Poole et al. | |
| 7,857,960 B2 | 12/2010 | Hayashi et al. | |
| 7,879,218 B1 * | 2/2011 | Webb | .................. C25D 5/34 |
| | | | 205/210 |
| 8,048,284 B2 | 11/2011 | Reddington et al. | |
| 8,268,157 B2 | 9/2012 | Niazimbetova | |
| 8,268,158 B2 | 9/2012 | Niazimbetova et al. | |
| 9,506,158 B2 * | 11/2016 | Rohde | ....................... C25D 3/38 |
| 2001/0013472 A1 * | 8/2001 | Nakamura et al. | ............ 205/103 |
| 2004/0226827 A1 * | 11/2004 | Matsuda | .................. C25D 5/02 |
| | | | 205/123 |
| 2010/0320609 A1 * | 12/2010 | Mayer | ................. H01L 21/2885 |
| | | | 257/773 |
| 2011/0180412 A1 * | 7/2011 | Shimoyama | ............. C25D 5/08 |
| | | | 205/118 |
| 2011/0290660 A1 * | 12/2011 | Niazimbetova et al. | ..... 205/297 |
| 2012/0175264 A1 * | 7/2012 | Lai | ...................... H01L 21/2885 |
| | | | 205/123 |
| 2014/0367279 A1 * | 12/2014 | Brogan | .................. C25D 21/12 |
| | | | 205/794 |

FOREIGN PATENT DOCUMENTS

| | | |
|---|---|---|
| EP | 1026286 A2 | 8/2000 |
| EP | 1371757 A1 | 12/2003 |
| EP | 1152071 B1 | 5/2005 |
| EP | 2025778 A2 | 2/2009 |
| EP | 2465976 A1 | 6/2012 |
| JP | 978251 A | 3/1997 |
| JP | 2001271196 A * | 10/2001 |
| JP | 2002245484 A | 9/2002 |
| JP | 2002363790 A | 12/2002 |
| JP | 200341393 A | 2/2003 |
| JP | 2004360055 A * | 12/2004 |
| JP | 4157985 B2 | 10/2008 |
| JP | 4762423 B2 | 8/2011 |
| WO | 0113472 | 2/2001 |
| WO | 2008157612 A1 | 12/2008 |
| WO | 2012175249 A1 | 12/2012 |

OTHER PUBLICATIONS

Rasmussen, et al, "Microvia filling: A challenge for process quality", OnBoard Technology, Apr. 2006, pp. 8-10.
European Search Report for corresponding European Application No. 14 15 9759, dated May 6, 2015.
Search Report from corresponding Taiwan Application No. 103109392, dated Jun. 17, 2016.
Search Report from corresponding Chinese Application No. 201410200977.8 dated Jun. 26, 2016.

* cited by examiner

*Primary Examiner* — Harry D Wilkins, III
(74) *Attorney, Agent, or Firm* — John J. Piskorski

(57) ABSTRACT

The methods inhibit or reduce dimpling and voids during copper electroplating of through-holes with flash copper layers in substrates such as printed circuit boards. An acid solution containing reaction products of aromatic heterocyclic nitrogen compounds and epoxy-containing compounds is applied to the through-holes of the substrate followed by filling the through-holes with copper using a copper electroplating bath which includes additives such as brighteners and levelers.

7 Claims, No Drawings

METHOD OF FILLING THROUGH-HOLES

FIELD OF THE INVENTION

The present invention is directed to a method of filling through-holes having a layer of flash copper which reduces or inhibits the formation of dimples and voids. More specifically, the present invention is directed to a method of filling through-holes having a layer of flash copper which reduces or inhibits the formation of dimples and voids by applying an aqueous acid pretreatment solution containing reaction products of aromatic heterocyclic nitrogen compounds with epoxy compounds at low concentrations to the through-holes with the flash copper layer followed by filling the through-holes with copper using an acid copper electroplating bath containing brighteners and levelers.

BACKGROUND OF THE INVENTION

High density interconnects is an important design in the fabrication of printed circuit boards with microvias and through-holes. Miniaturization of these devices relies on a combination of thinner core materials, reduced line widths and smaller diameter through-holes and blind vias. The diameters of the through-holes range from 75 µm to 200 µm. Filling the through-holes by copper plating has become more and more difficult with higher aspect ratios. This results in larger voids and deeper dimples. Another problem with through-hole filling is the way they tend to fill. Unlike vias which are closed at one end through-holes pass through a substrate and are open at two ends. Vias fill from bottom to top. In contrast, when through-holes are being filled with copper, the copper tends to begin to deposit on the walls at the center of the through-hole where it plugs at the center forming "butterfly wings" or two vias. The two vias fill to complete the deposition of the holes. Accordingly, the copper plating baths used to fill vias are not typically the same as are used to fill through-holes. Plating bath levelers and other bath additives are chosen to enable the right type of fill. If the right combination of additives is not chosen then the copper plating results in undesired conformal copper deposition.

Often the copper fails to completely fill the through-hole and both ends remain unfilled. An incomplete through-hole fill with copper deposit in the center with unfilled ends is sometimes referred to as "dog-boning". The open spaces at the top and bottom of the holes are referred to as dimples. Entire dimple elimination during through-hole filling is rare and unpredictable. Dimple depth is perhaps the most commonly used metric for quantifying through-hole fill performance. Dimple requirements depend on through-hole diameter and thickness and it varies from one manufacturer to another. In addition to dimples, gaps or holes referred to as voids may form within a copper through-hole fill. Larger dimples affect further processing of the panel and larger voids affect device performance. An ideal process completely fills through-holes with a high degree of planarity, i.e., build up consistency, without voids to provide optimum reliability and electrical properties and at as low as possible a surface thickness for optimum line width and impedance control in an electrical device.

Another problem associated with through-hole filling is filling through-holes with electrolytic copper when the through-hole walls have a layer of flash copper. Typically substrates containing through-holes, such as printed circuit boards, are copper clad with a layer of electroless copper on a surface and on the walls of the through-holes. Electroless copper thickness is usually greater than 0.25 µm. Such electroless copper layers tend to oxidize. Often printed circuit boards are electrolessly plated with copper and stored for a period of time prior to further processing. Prolonged periods of exposure to air as well as general handling of the boards result in relatively rapid oxidation of the electroless copper layer. To address this problem the industry electroplates a layer of flash copper 2 µm to 5 µm thick on the surface of the electroless copper prior to storage to protect the electroless copper from oxidation. Also, the thicker flash copper layer allows for removal of any oxide formation during storage by conventional etching processes whereas such etching cannot be done on the thinner electroless copper without the danger of damaging or removing the electroless copper layer. Unfortunately, electrolytic copper flash adds to the difficulty of filling through-holes. Dimpling and void formation frequently occur when workers try to fill through-holes using electrolytic acid copper plating baths.

Accordingly, there is a need for a method to improve through-hole filling in substrates which have a flash copper layer.

SUMMARY OF THE INVENTION

Methods include providing a substrate with a plurality of through-holes and a layer of copper flash on a surface of the substrate and walls of the plurality of through-holes; applying an aqueous acid solution to at least the plurality of through-holes, the aqueous acid solution consisting essentially of one or more inorganic acids and one or more reaction products of one or more aromatic heterocyclic nitrogen compounds and one or more epoxy-containing compounds, the one or more reaction products are in amounts of 1 ppm to 50 ppm; and electroplating at least the through-holes with copper using an acid copper electroplating bath comprising one or more brighteners and one or more levelers.

The methods reduce or inhibit dimple formation and voids during through-hole filling. Dimples are typically less than 10 µm deep. The reduced depth of the dimples and void area improves throwing power, thus provides a substantially uniform copper layer on the surface of the substrate and good through-hole filling.

DETAILED DESCRIPTION OF THE INVENTION

As used throughout this specification, the abbreviations given below have the following meanings, unless the context clearly indicates otherwise: g=gram; ml=milliliter; L=liter; cm=centimeter; mm=millimeter; µm=micron; ppm=parts per million; ppb=parts per billion; ° C.=degrees Centigrade; g/L=grams per liter; A=amperes; dm=decimeters; DI=deionized; wt %=percent by weight; $T_g$=glass transition temperature; Void=a space free of copper within a through-hole otherwise filled with copper metal; aspect ratio of a through-hole=height of the through-hole/the diameter of the through-hole; dimple depth=distance from the deepest point of the dimple to the level of copper plated on the surface of a substrate; void area of a single through-hole=0.5 A×0.5 B×π where A is height of the void and B is the diameter of the void at its widest point in a through-hole; through-hole area=height of the through-hole× the diameter of the through-hole; and % void area=void area/through-hole area×100%.

The terms "printed circuit board" and "printed wiring board" are used interchangeably throughout this specification. The terms "plating" and "electroplating" are used interchangeably throughout this specification. The term "throwing power" means the ability to plate in low current density areas with the same thickness as in higher current density areas. All amounts are percent by weight, unless otherwise noted. All numerical ranges are inclusive and combinable in any order except where it is logical that such numerical ranges are constrained to add up to 100%.

Aqueous acid solutions consist essentially of one or more inorganic acids and one or more reaction products of one or more aromatic heterocyclic nitrogen compounds and one or more epoxy-containing compounds. Preferably the aqueous acid solution consists of water, one or more inorganic acids and one or more reaction products of one or more aromatic heterocyclic nitrogen compounds and one or more epoxy-containing compounds. Preferably the aqueous acid solution is free of any additional components. The one or more reaction products are included in the aqueous acid solution in amounts of 1 ppm to 50 ppm, preferably 1 ppm to 40 ppm, more preferably from 2 ppm to 30 ppm.

Typically the aromatic heterocyclic nitrogen compounds are imidazole compounds and derivatives thereof. Preferably the imidazole compounds have a general formula:

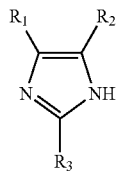

(I)

wherein $R_1$, $R_2$ and $R_3$ are independently chosen from H, $(C_1-C_{12})$alkyl, $(C_2-C_{12})$alkenyl, and aryl. Such imidazole compounds may be substituted with a $(C_1-C_{12})$alkyl, $(C_2-C_{12})$alkenyl, or aryl at the 4- and/or 5-position. Preferably, $R_1$, $R_2$ and $R_3$ are independently chosen from H, $(C_1-C_8)$alkyl, $(C_2-C_7)$alkenyl and aryl, more preferably H, $(C_1-C_6)$alkyl, $(C_3-C_7)$alkenyl and aryl, and even more preferably H, $(C_1-C_4)$alkyl, $(C_3-C_6)$alkenyl and aryl. The $(C_1-C_{12})$alkyl groups and the $(C_2-C_{12})$alkenyl groups may each optionally be substituted with one or more of hydroxyl groups, halogen, and aryl groups. Preferably, the substituted $(C_1-C_{12})$ alkyl group is an aryl-substituted $(C_1-C_{12})$alkyl group, and more preferably is $(C_1-C_4)$alkyl. Exemplary are $(C_1-C_4)$ alkyl groups include, without limitation, benzyl, phenethyl, and methylnaphthyl. Alternatively, each of the $(C_1-C_{12})$alkyl groups and the $(C_2-C_{12})$alkenyl groups may contain a cyclic alkyl or cyclic alkenyl group, respectively, fused with an aryl group. As used herein, the term "aryl" refers to any organic radical derived from an aromatic or heteroaromatic moiety by the removal of a hydrogen atom. Preferably, the aryl group contains 6-12 carbon atoms. The aryl group in the present invention may optionally be substituted with one or more of $(C_1-C_4)$alkyl and hydroxyl. Exemplary aryl groups include, without limitation, phenyl, tolyl, xylyl, hydroxytolyl, phenolyl, naphthyl, furanyl, and thiophenyl. The aryl group is preferably phenyl, xylyl or naphthyl. Exemplary $(C_1-C_{12})$alkyl groups and substituted $(C_1-C_{12})$alkyl groups include, without limitation, methyl, ethyl, n-propyl, iso-propyl, n-butyl, iso-butyl, sec-butyl, n-pentyl, 2-pentyl, 3-pentyl, 2-(2-methyl)butyl, 2-(2,3-dimethyl)butyl, 2-(2-methyl)pentyl, neopentyl, hydroxymethyl, hydroxyethyl, hydroxypropyl, cyclopentyl, hydroxcyclopentyl, cyclopentylmethyl, cyclopentylethyl, cyclohexyl, cyclohexylmethyl, hydroxyclohexyl, benzyl, phenethyl, naphthylmethyl, tetrahydronaphthalenyl and tetrahydronaphthylmethyl. Exemplary $(C_2-C_8)$alkenyl groups include, but are not limited to allyl, styrenyl, cyclopentenyl, cyclopentylmethyl, cyclopentenylethyl, cyclohexenyl, cyclohexenylmethyl and indenyl. Preferably, the at least one imidazole compound is substituted with a $(C_1-C_8)$alkyl, $(C_3-C_7)$alkenyl, or aryl at the 4- or 5-position. More preferably, the imidazole is substituted with $(C_1-C_6)$alkyl, $(C_3-C_7)$alkenyl, or aryl at the 4- or 5-position. Still more preferably, the imidazole is substituted at the 4- or 5-position with methyl, ethyl, propyl, butyl, allyl or aryl. The imidazole compounds are generally commercially available from a variety of sources, such as Sigma-Aldrich (St. Louis, Mo.) or may be prepared from methods disclosed in the literature.

Preferably the one or more epoxy-containing compounds have the general formula:

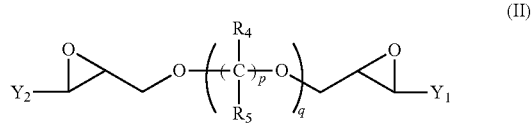

(II)

where $Y_1$ and $Y_2$ are independently chosen from hydrogen and $(C_1-C_4)$alkyl, $R_4$ and $R_5$ are independently chosen from hydrogen, $CH_3$ and OH, p=1-6 and q=1-20. Preferably, $Y_1$ and $Y_2$ are both H. When p=2, it is preferred that each $R_4$ is H, $R_5$ is chosen from H and $CH_3$, and q=1-10. When p=3, it is preferred that at least one $R_5$ is chosen from $CH_3$ and OH, and q=1. When p=4, it is preferred that both $R_4$ and $R_5$ are H, and q=1. Exemplary compounds of formula (II) include, but are not limited to: 1,4-butanediol diglycidyl ether, ethylene glycol diglycidyl ether, di(ethylene glycol)diglycidyl ether, poly(ethylene glycol)diglycidyl ether compounds, glycerol diglycidyl ether, neopentyl glycol diglycidyl ether, propylene glycol diglycidyl ether, di(propylene glycol)diglycidyl ether, and poly(propylene glycol)diglycidyl ether compounds. Poly(ethylene glycol)diglycidyl ether compounds of formula (II) are those compounds where each of $R_4$ and $R_5$=H, p=2, and q=3-20, and preferably q=3-15, more preferably q=3-12, and still more preferably q=3-10. Exemplary poly(ethylene glycol)diglycidyl ether compounds include tri(ethylene glycol)diglycidyl ether, tetra (ethylene glycol)diglycidyl ether, penta(ethylene glycol)diglycidyl ether, hexa(ethylene glycol)diglycidyl ether, nona (ethylene glycol)diglycidyl ether, deca(ethylene glycol) diglycidyl ether, and dodeca(ethylene glycol)diglycidyl ether. Poly(propylene glycol)diglycidyl ether compounds of formula (II) are those compounds where each of $R_4$=H and one of $R_5$=$CH_3$, p=2, and q=3-20, and preferably q=3-15, more preferably q=3-12, and still more preferably q=3-10. Exemplary poly(propylene glycol)diglycidyl ether compounds include tri(propylene glycol)diglycidyl ether, tetra (propylene glycol)diglycidyl ether, penta(propylene glycol) diglycidyl ether, hexa(propylene glycol)diglycidyl ether, nona(propylene glycol)diglycidyl ether, deca(propylene glycol)diglycidyl ether, and dodeca(propylene glycol)diglycidyl ether. Suitable poly(ethylene glycol)diglycidyl ether compounds and poly(propylene glycol)diglycidyl ether compounds are those having a number average molecular weight of from 350 to 10000, and preferably from 380 to 8000.

Preferably one or more imidazoles of formula (I) are reacted with one or more epoxy-containing compounds of formula (II) to form the reaction products using conventional methods known in the art or described in the literature. Typically, a desired amount of the imidazole and epoxy-containing compounds are added into a reaction flask, followed by addition of water. The resulting mixture is heated to approximately 75-95° C. for 4 to 6 hours. After an additional 6-12 hours of stirring at room temperature, the resulting reaction product is diluted with water. The reaction product may be used as-is in aqueous solution, may be purified or may be isolated as desired.

In general, the reaction products have a number average molecular weight (Mn) of 500 to 10,000, although reaction products having other Mn values may be used. Such reaction products may have a weight average molecular weight (Mw) value in the range of 1000 to 50,000, although other Mw values may be used. Typically, Mw is from 1000 to 20,000, or such as from 1500 to 5000 or such as from 5000 to 15,000.

Typically, the ratio of the imidazole compound to the epoxy-containing compound is from 0.1:10 to 10:0.1. Preferably, the ratio is from 0.5:5 to 5:0.5 and more preferably from 0.5:1 to 1:0.5. Other suitable ratios of imidazole compound to epoxy-containing compound may be used to prepare the reaction products.

Inorganic acids include, but are not limited to sulfuric acid, hydrochloric acid, nitric acid, hydrofluoric acid or phosphoric acid. Preferably the inorganic acid is sulfuric acid, hydrochloric acid or nitric acid, more preferably the acid is sulfuric acid or hydrochloric acid. Such acids may be included in the aqueous acid solutions in amounts of 0.5 wt % to 20 wt %, preferably 5 wt % to 15 wt %, more preferably from 8 wt % to 12 wt %. Typically the pH of the solution is 0 to 1, more typically less than 1.

The aqueous acid solutions may be applied to cleaned copper clad substrates with a plurality of through-holes by any suitable method, such as by immersing or dipping the substrate into the solution. The solution may be applied to the substrate by spraying it onto the substrate or by applying the solution with an atomizer using conventional apparatus. Temperatures may range from room temperature to 60° C., typically from room temperature to 40° C.

The substrates are typically plated with a layer of electroless copper such that the electroless copper is adjacent a surface of the substrate and the walls of the through-holes. The electroless copper may have a thickness, typically, from 0.25 μm to 6 μm, more typically from 0.25 μm to 3 μm. The electroless copper is plated with a layer of electrolytic flash copper to protect it from corrosion. The thickness of the electroplated flash copper adjacent the electroless copper layer ranges from 0.5 μm to 15 μm, typically from 1 μm to 10 μm, more typically from 1 μm to 5 μm.

The through-holes of the substrate typically range in diameter from 75 μm to 200 μm. The through-holes traverse the width of the substrates and are typically 100 μm to 400 μm.

Substrates include printed circuit boards which may contain thermosetting resins, thermoplastic resins and combinations thereof, including fiber, such as fiberglass, and impregnated embodiments of the foregoing.

Thermoplastic resins include, but are not limited to acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The printed wiring boards may include low or high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The dwell time for the solution on the substrate may range from 0.5 to 10 minutes, preferably from 0.5 minutes to 8 minutes, more preferably from 1 to 6 minutes. The treated substrate is then electroplated with copper using an acid copper electroplating bath to fill the through-holes. In addition to one or more sources of copper ions and one or more acids, the acid copper electroplating bath also includes at least one or more brighteners and one or more levelers. The acid copper electroplating bath may also include one or more of the reaction products of formula (I) and formula (II) described above. As disclosed in U.S. Pat. No. 8,268,158 the reaction products of formula (I) and formula (II) may have leveling activity on copper electroplating deposits.

Sources of copper ions include, but are not limited to water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. Copper salts are included in the bath in amounts of 50 g/l to 350 g/L, typically 100 g/L to 250 g/L.

Acids include, but are not limited to sulfuric acid, hydrochloric acid, hydrofluoric acid, phosphoric acid, nitric acid, sulfamic acid and alkylsulfonic acids. Such acids are included in conventional amounts. Typically such acids are included in the acid copper baths in amounts of 25 g/l to 350 g/L.

Brighteners include, but are not limited to 3-mercaptopropylsulfonic acid and its sodium salt, 2-mercapto-ethanesulfonic acid and its sodium salt, and bissulfopropyl disulfide and its sodium salt, 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl)-disulfide sodium salt, methyl-(ω-sulfopropyl)-trisulfide disodium salt, O-ethyl-dithiocarbonic acid-S-(ω-sulfopropyl)-ester, potassium salt thioglycoli acid, thiophosphoric acid-O-ethyl-bis-(ω-sulfpropyl)-ester disodium salt, thiophosphoric, acid-tris(ω-sulfopropyl)-ester trisodium salt, N,N-dimethyldithiocarbamic acid (3-sulfopropyl) ester, sodium salt, (O-ethyldithiocarbonato)-S-(3-sulfopropyl)-ester, potassium salt, 3-[(aminoiminomethyl)-thio]-1-propanesulfonic acid and 3-(2-benzthiazolylthio)-1-propanesulfonic acid, sodium salt. Preferably the brightener is bissulfopropyl disulfide or its sodium salt. Typically the brighteners are included in amounts of 1 ppb to 500 ppm, preferably from 50 ppb to 10 ppm.

Levelers include, but are not limited to, alkylated polyalkyleneimines and organic sulfo sulfonates. Preferably the levelers are the reaction products of formula (I) and formula (II). Levelers are included in the conformal copper electroplating baths in amounts of 0.5 ppm to 1000 ppm, preferably from 1 ppm to 500 ppm, more preferably from 1 ppm to 100 ppm.

Other additives which may be included in the copper electroplating baths are one or more complexing agents, one or more sources of chloride ions, stabilizers such as those which adjust mechanical properties, provide rate control, refine grain structure and modify deposit stress, buffering agents, suppressors and carriers. They may be included in the acid copper electroplating bath in conventional amounts.

Through-hole filling is typically done at current densities of 0.5 A/dm$^2$ to 5 A/dm$^2$, preferably from 1 A/dm$^2$ to 3 A/dm$^2$. The plating bath temperature may range from room temperature to 60° C., typically from room temperature to 40° C. Electroplating is done until the through-holes are filled with minimum copper on the surfaces to make it easier for post treatment and prepare the substrate for further processing.

The methods reduce or inhibit dimple formation and voids during through-hole filling. The void area as well as the % void area of through-holes is reduced or eliminated. Dimple formation is typically 10 μm or less, more typically dimple size is less than 10 μm with no voids in the through-holes which is the preferred industry standard. The reduced depth of the dimples and voids improves throwing power, thus provides a substantially uniform copper layer on the surface of the substrate.

The following examples are included to further illustrate the invention but are not intended to limit its scope.

Example 1

63 mmol of 1,4-Butanediol diglycidyl ether (monomer 1), 25 mmol of imidazole (monomer 2) and 75 mmol of 4-phenylimidazole (monomer 3) were added at room temperature into a round-bottom reaction flask. Then, 30 ml of DI water was added to the flask. The initially formed white colored suspension eventually disappeared as the reaction temperature increased and turned into a phase separated mixture. The reaction mixture was heated for 2 hours using an oil bath set to 98° C. After adding 2 ml of concentrated sulfuric acid into the reaction flask, the solution became transparent with a light-yellow color. The mixture was heated for an additional 3 hours and left stirring at room temperature for another 8 hours. The resulting amber colored reaction product was transferred into a volumetric flask, rinsed and diluted with 0.5-1% sulfuric acid. The reaction product solution was used without further purification. Analysis of the reaction product by $^1$H NMR (500 MHz, DMSO-d$_6$) showed the following peaks, confirming the structure: δ ppm: 9.22-7.22 (m, 24H, H$_{arom}$); 4.52-3.00 (m, 37.2H (2.65×14H), 4CH$_2$—O, 2CH—OH, 2CH$_2$—N); and 1.74-1.24 (m, 10.6H (2.653×4H), 2CH$_2$).

The UV-absorption of the reaction products was determined in water using an Agilent 8453 spectrophotometer and the λ$_{max}$ (nm) was determined to be 198,259. The molar ratio of monomer 1:monomer 2:monomer 3 was 2.4:3:1.

Examples 2

Two FR4/glass-epoxy coupons 5 cm wide, 15 cm long and 100 μm thick with a plurality of through-holes were provided by Tech Circuit. The through-holes had an average diameter of 100 μm. The coupons were plated with electroless copper on the surface and in the through-holes. The thickness of the electroless copper layer was 0.3 μm.

One coupon was placed in a dessicator until further processing to discourage oxidation of the copper and the other was plated with a layer of flash copper by placing the electroless copper coupon in a plating cell which contained an acid copper electroplating bath with a formula as shown in Table 1.

TABLE 1

| COMPONENT | AMOUNT |
| --- | --- |
| Copper sulfate pentahydrate | 220 g/L |
| Sulfuric acid | 40 g/L |
| Chloride ion from hydrochloric acid | 50 ppm |
| Polyethylene glycol | 2 g/L |
| 4-phenylimidazole/imidazole/1,4-butanediol diglycidyl ether copolymer | 50 mg/L |
| Bis-(sodiumsulfopropyl)-disulfide | 10 mg/L |
| Water | To one liter |

The coupon was connected to a conventional DC rectifier. The counter electrode was an insoluble anode. The plating baths were air agitated during electroplating. The current density was set at 1 A/dm$^2$. Copper electroplating was done for 20 minutes to deposit a flash copper layer of 5 μm on the electroless copper layer on the surface and walls of the through-holes. The coupon was then placed in the dessicator with the other coupon.

Upon removing the coupons from the dessicator, the coupons were cleaned using a conventional copper surface cleaner to remove the oxide layer and have a clean surface for further processing. Each coupon was then placed into two separate plating cells containing the copper electroplating bath of Table 1. The counter electrodes were insoluble anodes. Acid copper electroplating was done at a current density of 1.5 A/dm$^2$ with continuous air agitation of the bath for 82 minutes. After electroplating the coupons were removed from the plating cells, rinsed with DI water and sectioned for an analysis of copper layer uniformity and through-hole filling. The sectioned samples were examined using an optical microscope. Good plug and fill with an average dimple depth of 4.3 μm and an average void area of 10% was observed on the copper coupon which included only the electroless copper layer whereas no plug or partially filled holes were observed on the copper coupon which included both the electroless and flash copper layers.

Example 3

Two FR4/glass-epoxy coupons 5 cm wide, 15 cm long and 100 μm thick with a plurality of through-holes were provided by Tech Circuit. The through-holes had an average diameter of 100 μm. Each coupon included a layer of electroless copper 0.3 μm. One coupon was placed in a dessicator and the other was electroplated with a flash copper layer 5 μm thick as described in Example 2 above. The coupon was then placed in the dessicator with the other coupon until further processing to discourage oxide formation on the copper.

Upon removing the coupons from the dessicator, both were cleaned using a conventional copper surface cleaner to remove any oxide and provide a clean copper surface for further processing. Each coupon was then placed into two separate plating cells containing the copper electroplating bath of Table 1. The counter electrodes were insoluble anodes. Acid copper electroplating was done at a current density of 1.5 A/dm² with continuous air agitation of the baths for 82 minutes. After electroplating the coupons were removed from the plating cells, rinsed with DI water and sectioned for an analysis of copper layer uniformity and through-hole filling. The sectioned samples were examined using an optical microscope. Good plug and fill with an average dimple depth of 4.1 μm and an average void area of 10% was observed on the coupon which only had an electroless copper layer whereas no plug or partially filled holes were observed on the coupon with the electroless and flash copper layers.

Examples 4

Two FR4/glass-epoxy coupons 5 cm wide, 15 cm long and 100 μm thick with a plurality of through-holes were provided by Tech Circuit. The through-holes had an average diameter of 100 μm. Each coupon included a layer of electroless copper 0.3 μm. The coupons were cleaned using a conventional cleaner and then electroplated with a flash copper layer 5 μm thick as described in Example 2 above. The coupons were then placed in a dessicator until further processing.

Upon removal from the dessicator, the flashed coupons were cleaned to remove any oxide and have clean a copper surface for further processing. One coupon was transferred to the acid copper plating bath having the formula in Table 1. The second coupon was immersed into an aqueous acid solution of 10 wt % sulfuric acid with 12.5 ppm of the reaction product of Example 1 for 5 minutes. The coupon was then transferred into the acid copper electroplating bath as described in Table 1. Copper electroplating was done at a current density of 1.5 A/dm² with continuous air agitation of the bath for 82 minutes. After electroplating the coupons were removed from the plating cells, rinsed with DI water and sectioned for an analysis of copper layer uniformity and through-hole filling. The sectioned samples were examined under a conventional optical microscope. None of the through-holes observed were filled in the copper coupon which was just plated with flash copper. In contrast, the coupon which was immersed in the acid solution containing the reaction product of Example 1 had all of the through-holes filled with an average dimple depth of 4.1 μm and no voids were observed.

Examples 5-10

Six FR4/glass-epoxy coupons 5 cm wide, 15 cm long and 100 μm thick with a plurality of through-holes were provided. The through-holes had an average diameter of 100 μm. Each coupon included a layer of electroless copper 0.3 μm. The coupons were cleaned using a conventional cleaner and then electroplated with a flash copper layer 5 μm thick as described in Example 2 above. The coupons were then placed in a dessicator until further processing.

Upon removal of the coupons from the dessicator, the flashed coupons were cleaned. Each coupon was then immersed into separate aqueous acid solutions of 10 wt % sulfuric acid and varying concentrations of the reaction product of Example 1 for 5 minutes. The concentrations of the reaction product in each solution are shown in Table 2 below. After 5 minutes the coupons were removed from the solutions and then placed in plating cells containing an acid copper electroplating bath as described in Table 1. The coupons were electroplated at a current density of 1.5 A/dm² for 82 minutes with air agitation to form a copper layer of 25 μm thick. After copper plating was completed, the coupons were removed from the plating cells, rinsed with DI water and allowed to air dry at room temperature. Each coupon was then sectioned to examine the dimple height and voids of the through-holes. The dimple depth was measured using an optical microscope. The dimple depth was the distance from the deepest part of the dimple to the level of the copper layer on the surface of the coupon as measured in microns. The area of a particular void was determined using the formula: void area=$0.5\ A \times 0.5\ B \times \pi$ where A is the height of the void and B is the diameter of the void at its widest point. The formula used to determine % void area=void area/hole area×100% where hole area is height of the through-hole without any copper flash layer× the diameter of the through-hole. The results are in Table 2 below.

TABLE 2

| EXAMPLE | Reaction Product Concentration ppm | Dimple Size μm | Void % |
|---|---|---|---|
| 5 | 1 | 13.5 | 0 |
| 6 | 3.1 | 4.5 | 0 |
| 7 | 6.25 | 4.8 | 0.9 |
| 8 | 12.5 | 4.1 | 0 |
| 9 | 25 | 1.74 | 0 |
| 10 | 50 | 13.6 | 0 |

Although no voids were observed in the sectioned coupons with the exception of Example 7 which had an average void area of 0.9% and the average dimple size for Examples 5 and 10 exceeded the 10 μm target, the reaction product of Example 1 showed good overall performance within a concentration range of greater than 1 ppm but less than 50 ppm.

What is claimed is:

1. A method consisting of:
   a) providing a substrate with a plurality of through-holes and a layer of copper flash on a surface of the substrate and walls of the plurality of through-holes;
   b) treating the substrate by applying an aqueous acid solution to at least the plurality of through-holes, the aqueous acid solution consisting of one or more inorganic acids, one or more reaction products of one or more aromatic heterocyclic nitrogen compounds and one or more epoxy-containing compounds, the one or more reaction products are in amounts of 1 ppm to 50 ppm, and water;
   c) providing an acid copper electroplating bath comprising one or more sources of copper ions, one or more acids, one or more brighteners and one or more levelers;
   d) immersing the treated substrate in the acid copper electroplating bath comprising one or more sources of copper ions, one or more acids, one or more brighteners and one or more levelers; and e) electroplating to at least fill the through-holes of the treated substrate with copper using the acid copper electroplating bath comprising one or more sources of copper ions, one or more acids, one or more brighteners and one or more levelers.

2. The method of claim 1, wherein the one or more aromatic heterocyclic nitrogen compounds is an imidazole having formula:

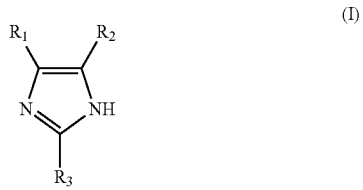

wherein $R_1$, $R_2$ and $R_3$ are independently chosen from H, substituted or unsubstituted $(C_1-C_{12})$alkyl, substituted or unsubstituted $(C_2-C_{12})$alkenyl, and substituted or unsubstituted aryl and provided that $R_1$ and $R_2$ are not both H.

3. The method of claim 2, wherein $R_1$, $R_2$ and $R_3$ are independently chosen from H, substituted or unsubstituted $(C_1-C_8)$alkyl, substituted or unsubstituted $(C_2-C_7)$alkenyl and substituted or unsubstituted aryl.

4. The method of claim 1, wherein the one or more epoxy-containing compounds has formula:

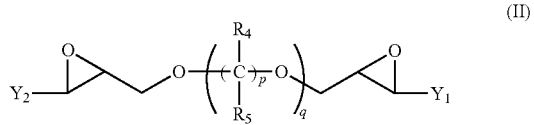

wherein $Y_1$ and $Y_2$ are independently chosen from hydrogen and $(C_1-C_4)$alkyl, $R_4$ and $R_5$ are independently chosen from hydrogen, $CH_3$ and OH, p=1-6 and q=1-20.

5. The method of claim 4, wherein the one or more epoxy-containing compounds are chosen from 1,4-butanediol diglycidyl ether, ethylene glycol diglycidyl ether, di(ethylene glycol) diglycidyl ether, poly(ethylene glycol) diglycidyl ether compounds, glycerol diglycidyl ether, neopentyl glycol diglycidyl ether, propylene glycol diglycidyl ether, di(propylene glycol) diglycidyl ether, and poly(propylene glycol) diglycidyl ether compounds.

6. The method of claim 1, wherein the reaction product is in a range of 1 ppm to 40 ppm.

7. The method of claim 1, wherein the one or more brighteners of the acid copper electroplating bath are chosen from 3-mercapto-propylsulfonic acid and its sodium salt, 2-mercapto-ethanesulfonic acid and its sodium salt, and bissulfopropyl disulfide and its sodium salt, 3-(benzthiazoyl-2-thio)-propylsulfonic acid sodium salt, 3-mercaptopropane-1-sulfonic acid sodium salt, ethylenedithiodipropylsulfonic acid sodium salt, bis-(p-sulfophenyl)-disulfide disodium salt, bis-(ω-sulfobutyl)-disulfide disodium salt, bis-(ω-sulfohydroxypropyl)-disulfide disodium salt, bis-(ω-sulfopropyl)-disulfide disodium salt, bis-(ω-sulfopropyl)-sulfide disodium salt, methyl-(ω-sulfopropyl)-disulfide sodium salt, methyl-(ω-sulfopropyl)-trisulfide disodium salt, O-ethyl-dithiocarbonic acid-S-(ω-sulfopropyl)-ester, potassium salt thioglycoli acid, thiophosphoric acid-O-ethyl-bis-(ω-sulfpropyl)-ester disodium salt, thiophosphoric, acid-tris(ω-sulfopropyl)-ester trisodium salt, N,N-dimethyldithiocarbamic acid (3-sulfopropyl) ester sodium salt, (O-ethyldithiocarbonato)-S-(3-sulfopropyl)-ester potassium salt, 3-[(amino-iminomethyl)-thio]-1-propanesulfonic acid and 3-(2-benzthiazolylthio)-1-propanesulfonic acid sodium salt.

* * * * *